United States Patent [19]

Kwon et al.

[11] Patent Number: 5,488,231
[45] Date of Patent: Jan. 30, 1996

[54] METAL/SEMICONDUCTOR JUNCTION SCHOTTKY DIODE OPTICAL DEVICE USING A DISTORTION GROWN LAYER

[75] Inventors: O-Kyun Kwon, Daejeon; Young-Wan Choi, Seoul; El-Hang Lee, Daejeon, all of Rep. of Korea

[73] Assignee: Electronics and Telecommunications Research Institute, Daejeon-shi, Rep. of Korea

[21] Appl. No.: 352,628

[22] Filed: Dec. 9, 1994

[30]   Foreign Application Priority Data

Nov. 23, 1994 [KR] Rep. of Korea ............... 94-30898

[51] Int. Cl.$^6$ ............................. H01L 27/14; H01L 31/00
[52] U.S. Cl. ............................. 257/17; 257/18; 257/21; 257/432; 257/453; 257/455
[58] Field of Search ............................. 257/21, 17, 15, 257/184, 432, 453, 454, 449, 455, 456, 18

[56]   References Cited

U.S. PATENT DOCUMENTS

| | | | |
|---|---|---|---|
| 4,546,244 | 10/1985 | Miller | 250/211 J |
| 4,751,378 | 6/1988 | Hinton et al. | 250/211 J |
| 4,754,132 | 6/1988 | Hinton et al. | 250/211 J |
| 5,053,843 | 10/1991 | Choudhury et al. | 257/21 |
| 5,233,184 | 8/1993 | Chirovsky et al. | 250/214 LS |

FOREIGN PATENT DOCUMENTS

| | | | |
|---|---|---|---|
| 0249645 | 12/1987 | European Pat. Off. | 257/21 |
| 2199877 | 8/1990 | Japan | 257/21 |
| 4015367 | 7/1994 | WIPO | 257/449 |

*Primary Examiner*—William Mintel
*Attorney, Agent, or Firm*—Antonelli, Terry, Stout & Kraus

[57]   ABSTRACT

A metal/semiconductor junction Schottky diode optical device using a distortion grown layer is described. A plurality of GaAs mirror and AlAs mirror layers are periodically grown on a semi-insulating GaAs substrate. An n+ or p+ semiconductor layer is formed on the GaAs mirror and AlAs mirror layers. A GaAs buffer layer is formed on the semiconductor layer to grow a Schottky metal layer serving as an electrode and a mirror. A multiple quantum well structure having an electro-optical absorption characteristic is positioned between the semiconductor layer and Schottky metal layer, for constructing a diode with the metal layer/multiple quantum well structure. At least a part of the mirror layers and diode are formed with a layer in order to have resonance and non-resonance conditions between the metal layer and mirror layers. The substrate on which the diode is formed has an opposite side formed with an optical non-reflective layer.

3 Claims, 5 Drawing Sheets

METAL/SEMICONDUCTOR JUNCTION SCHOTTKY DIODE OPTICAL DEVICE USING A DISTORTION GROWN LAYER

BACKGROUND OF THE INVENTION

The present invention relates to a metal/semiconductor junction Schottky diode optical device using a distortion grown layer, and more particularly to an optical device using a multiple quantum well structure having an electro-optical absorption effect in a compound semiconductor as an intermediate layer of a metal/semiconductor junction Schottky diode.

Generally, optical devices using a heterogeneous junction compound semiconductor, especially devices using a non-linear electro-optical absorption effect, are important devices in optical exchange and communication systems which process an optical signal in the vertical direction of the devices, and as a result, have advantages such as parallel processing of the optical signal, high integration of the devices, etc.

An optical device such as self electro-optical effect device having a multiple quantum well structure in intermediate layer of a conventional pin diode is able to produce optical bistable characteristics used for an optical logic function if a symmetrical structure is present having a negative resistance characteristic of the diode. The speed and signal processing performance of an optical device, with the pin diode structure, having electronic device properties involving charge/discharge of optical current caused by a light signal is mainly determined by the light intensity of an operating signal. Therefore, the device is greatly influenced by an absorption saturation effect and a thermal effect when a strong light intensity is required for high-speed signal processing. In particularly, a device having optical bistable characteristics has a deterioration in performance caused by the thermal effect.

In a pin diode structure receiving the light signal from the upper portion of a diode layer grown on a thick substrate, it is difficult to overcome the thermal deterioration of the device performance caused by a temperature rise. A thermal cancellation layer is required having an excellent thermal conductivity at a small distance (within a few μm) from a thermal source in order to cancel the local thermal effects on an active layer of an intermediate portion of the diode. In the conventional pin structure, since the thickness of a upper electrode layer and a mirror layer is limited and an upper layer of the structure should be open to the reception of a signal light, effective thermal cancellation is difficult. To solve this problem, a device structure for canceling a localized thermal rise generated from the device is required. However, in the device having the conventional pin diode GaAs/$Al_xGa_{1-x}As$ structure, since a thermal cancellation layer is applied with respect to a local thermal source, a serious problem arises in a manufacturing process.

SUMMARY OF THE INVENTION

It is therefore an object of the invention to provide a metal/semiconductor junction Schottky diode optical device which operates in response to optical signals at a high output operation without influence from localized thermal effects and can be used to obtain an economic high performance optical logic device.

In accordance with one aspect of the invention, a plurality of GaAs mirror and AlAs mirror layers are periodically grown on a semi-insulating GaAs substrate. An n+ or p+ semiconductor layer is formed on the GaAs mirror and AlAs mirror layers. A GaAs buffer layer is formed on the semiconductor layer to grow a Schottky metal layer serving as an electrode and a mirror. A multiple quantum well structure having an electro-optical absorption characteristic is positioned between the semiconductor layer and Schottky metal layer to provide a diode having a well structure. A part of or all parts of the mirror layers and diode are formed with a distortion layer in order to have resonance and non-resonance conditions between the metal layer and mirror layers. The substrate on which the diode is formed has an opposite side formed with an optically non-reflective layer.

BRIEF DESCRIPTION OF THE DRAWINGS

For a better understanding of the invention and to show how the same may be carried into effect, reference will now be made, by way of example only, to the attached drawings, in which.

DETAILED DESCRIPTION OF THE PREFERRED EMBODIMENT

Figure 1:
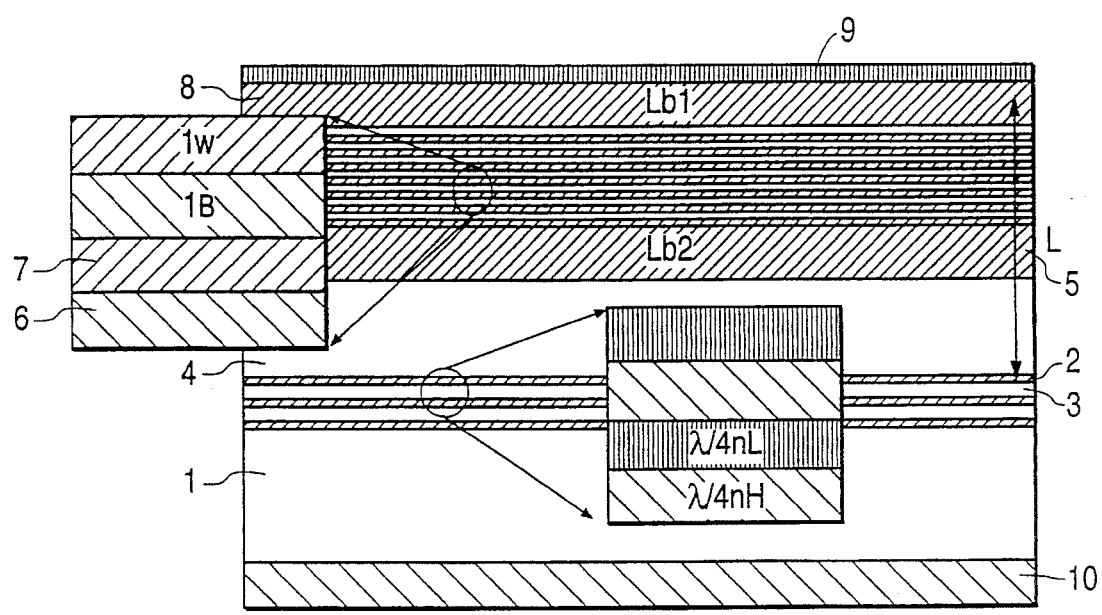
FIG. 1 is a cross sectional view showing an example of a metal/n-type (or metal/p-type) semiconductor junction optical device according to the present invention.

FIG. 1 shows an example of a metal/semiconductor junction Schottky diode structure in accordance with the invention. A GaAs mirror layer 2 and an AlAs mirror layer 3 (or distorted $In_xGa_{1-x}As$ and $In_yAl_{1-y}As$ layers) are grown on a GaAs substrate 1 of a semi-insulating substrate to a thickness of $\lambda/4nH$ and $\lambda/4nL$, respectively, with $\lambda$ being an operating wavelength determined by a quantum well structure. The periodically repeated number of the GaAs and AlAs mirror layers is selected according to resonance conditions to determine a reflectance. An N+ (or P+) semiconductor layer 4 grown on the periodic mirror layers is formed with an $Al_{0.1}Ga_{0.9}As$ (or $In_xGa_{1-x}As$, GaAs, etc.) layer doped with a high concentration and a first GaAs buffer layer 5, undoped to prevent an n-type dopant from diffusing, is formed thereon having a constant thickness Lb2.

An intrinsic layer is constructed with a multiple quantum well structure including a quantum barrier layer 6 of a GaAs layer and a quantum well layer 7 of an $In_xGa_{1-x}As$ layer. A second undoped GaAs buffer layer 8 is formed on the intrinsic region to a constant thickness Lb1 and a metal layer 9 is formed on the GaAs buffer layer 8 to form a Schottky electrode layer and a mirror layer. The upper mirror has a reflectance of approximately 95% between a semiconductor surface and a metal boundary.

The thickness L of a resonator from the metal surface to the semiconductor mirror surface is adjusted such that the reflection resonator satisfies resonance conditions at an operating wavelength λ determined by the quantum well structure of the GaAs and $In_xGa_{1-x}As$ layers. A potential Vbi between the Schottky metal layer (of Au, Ni, Pt, etc.) and the semiconductor layer is approximately 0.8 V for GaAs, 0.2 V for n-InGaAs, and 0.6 V for p-InGaAs. A large value is desirable for the diode structure of an optical device. For example, if the $GaAs/In_xGa_{1-x}As$ quantum well structure is used, the potential can be optimized by adjusting the ratio of the entire thickness of the well layer to the thickness (Lb1+Lb2) of the GaAs buffer layers and the entire thickness of the barrier layer. If the operating wavelength for the selected quantum well structure is determined, the layers on the substrate form a semiconductor layer having a long wavelength band gap with respect to a substrate structure in order to satisfy the condition that all the layers in the substrate direction should be transparent for this wavelength.

A non-reflective layer 10 is formed as a bottom layer so as that the surface of the substrate does not serve as a mirror (usually, the reflectance of air/semiconductor is 30%) with respect to signal light received from the substrate direction.

Figure 2:
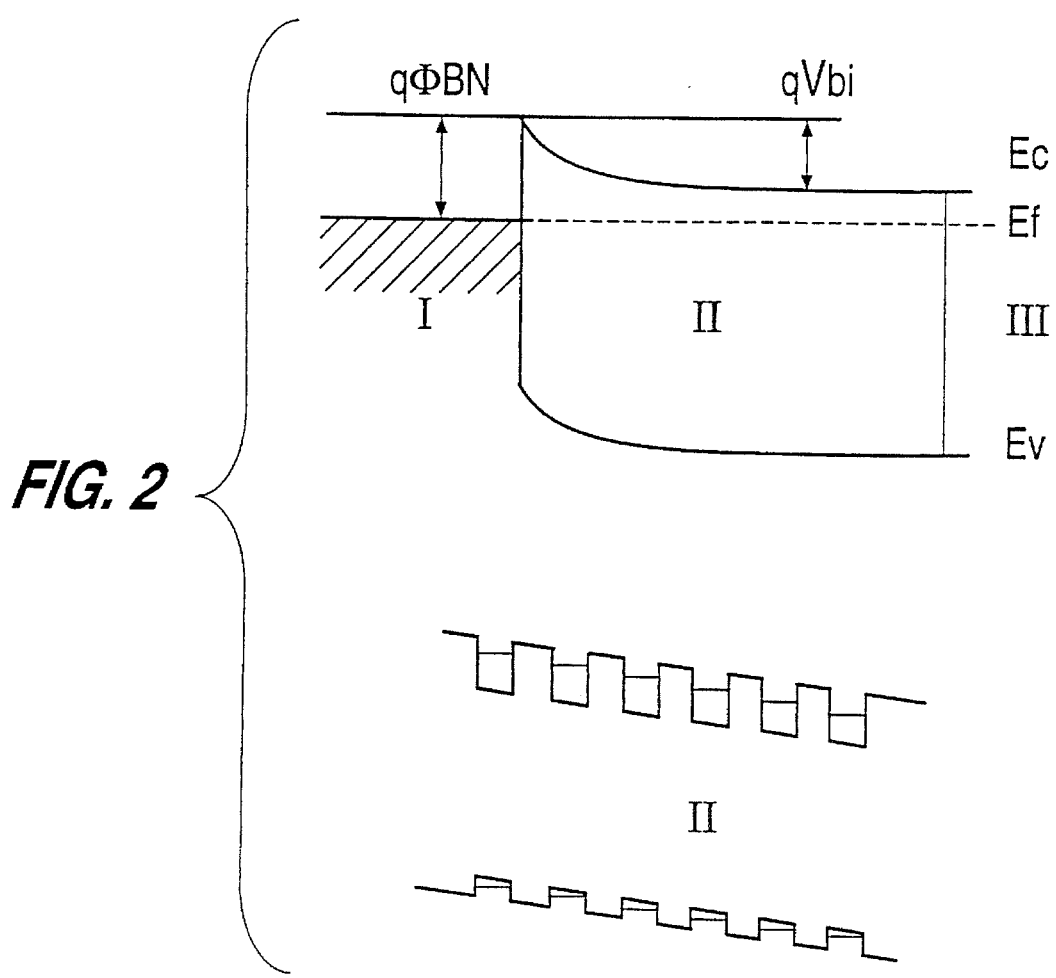
FIG. 2 is a band diagram of a metal/n-type semiconductor Schottky junction in accordance with the invention when there is no supply voltage.

FIG. 2 shows an energy level Ec at a semiconductor conduction band and an energy level Ev at a semiconductor valence band with respect to the Fermi level Ef when there is no external supply voltage in a metal/semiconductor junction diode with the multiple quantum well structure in accordance with the invention.

An intermediate (quantum) layer II including the GaAs buffer layers and $GaAs/In_xGa_{1-x}As$ quantum well structure layer is positioned between a metal layer I and an electrode (semiconductor) layer III and has a background doping concentration of $1*10E+15/cm^3$ or less. An absorption variation of the multiple quantum well in the intermediate layer II depends on an electric field variation of a depletion layer of a metal junction. The electric field intensity from metal/semiconductor boundaries is linearly reduced toward the semiconductor. To set a reflectance considering absorption when the supply voltage is 0, conditions of the depletion region should be considered.

In the $GaAs/In_xGa_{1-x}As$ quantum well structure, if the GaAs barrier is 5 nm thick and InGaAs well is 10 nm thick for the operating wavelength λ of 106.4 nm, an absorption coefficient α is 5500/cm for the electric field intensity of 0.5×10E4 V/cm. To provide impedance matching a metal layer reflectance of 95%, a semiconductor mirror reflectance of 30% and the thickness of the resonator, a reflectance of zero can be achieved with approximately 110 periodic quantum wells at a turn-off state of the device.

Figure 3:
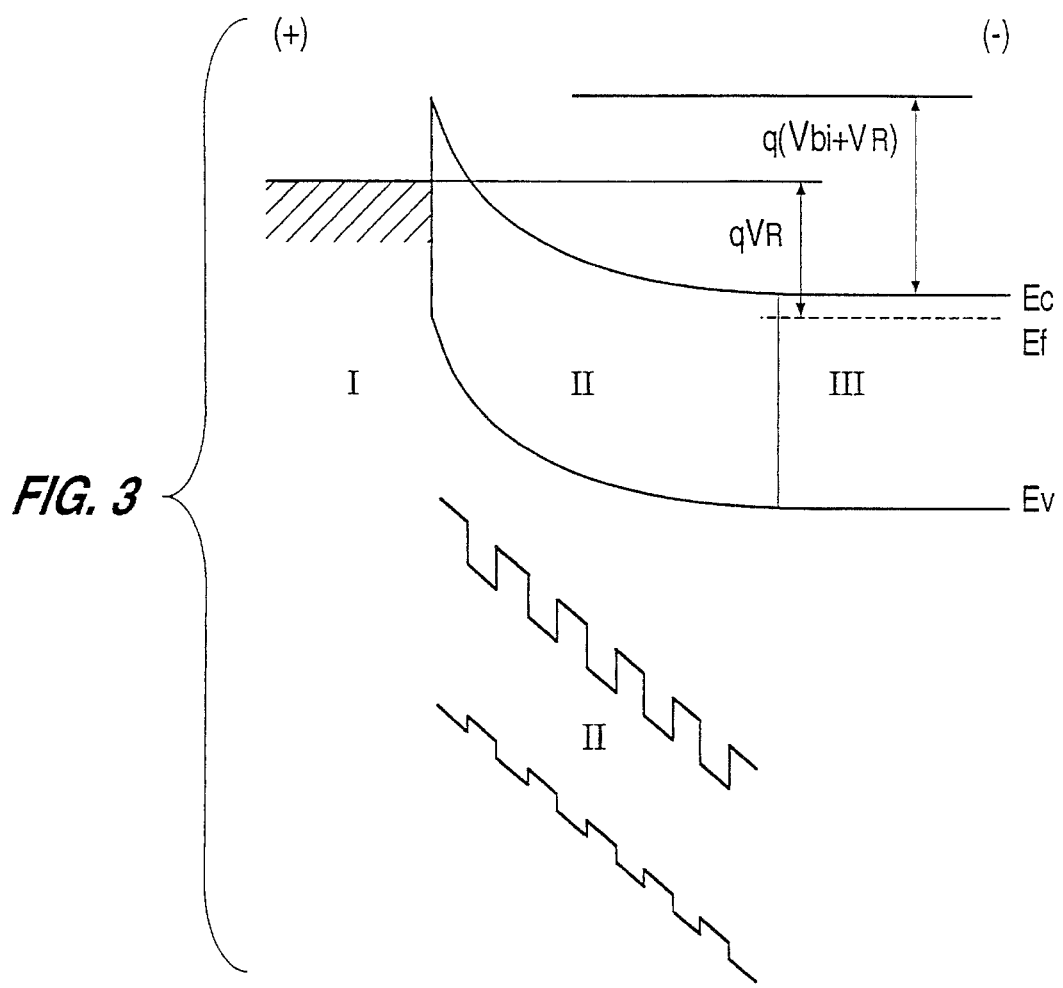
FIG. 3 is a band diagram of a metal/n-type semiconductor Schottky junction in accordance with the invention when a reverse supply voltage is applied.

FIG. 3 shows a band diagram when a reverse voltage is applied in the metal/semiconductor junction diode of FIG. 2. The depletion region becomes larger when the reverse voltage is applied by a Schottky characteristic and the intermediate quantum well structure is subject to a greater electric field thereby significantly reducing the absorption coefficient. In the $GaAs/In_xGa_{1-x}As$ quantum well structure as is in FIG. 2, if the electric field of 4×10E4 V/cm is applied, the absorption coefficient of the quantum well is greatly reduced to 2700/cm. That is, the device having a reflectance of 0 at 110 periodic quantum wells and the absorption coefficient of 5500/cm during an off state exhibits a large reflectance of 15% or more with the decreased absorption coefficient as a voltage is applied.

Figure 4A:
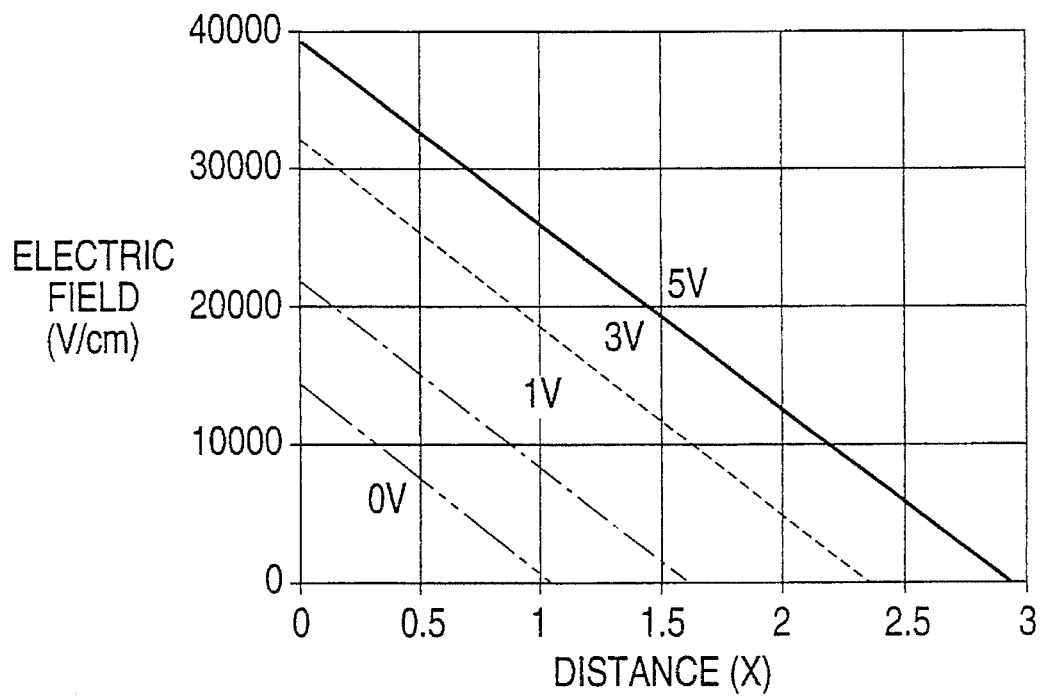
FIGS. 4A and 4B are graphs showing an electric field intensity and potential as a function of a distance from a metal/n-type semiconductor junction in accordance with the invention when a reverse supply voltage is applied.
Figure 4B:
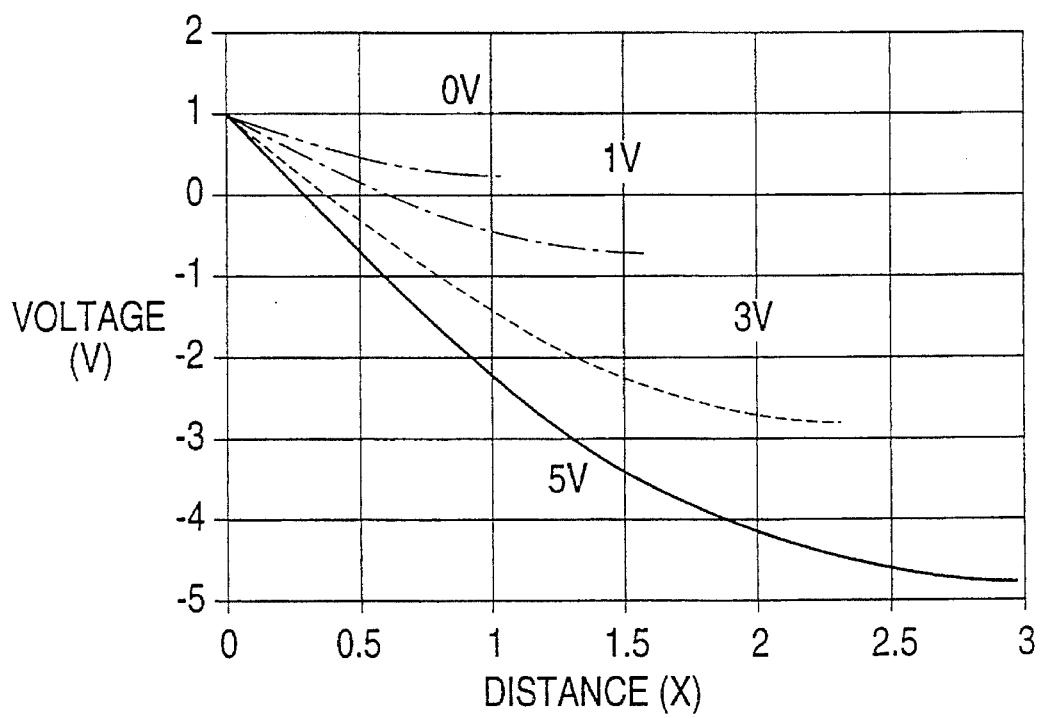

FIGS. 4A and 4B show the electric field intensity and potential as a function of a distance x from a junction in accordance with the invention. When incorporating the $GaAs/In_xGa_{1-x}As$ quantum well structure illustrated in FIGS. 2 and 3 in accordance with the invention, a variation of the electric field intensity of the intermediate depletion layer due to the metal/semiconductor junction changing the absorption in the quantum well by the amount shown in FIGS. 2 and 3 is theoretically calculated by using the following expressions:

$$W = \sqrt{\frac{2\epsilon S}{qN_D}(V_{bi} - V_R)} \quad (1)$$

$$E(x) = \frac{qN_D}{\epsilon S}(W - x) \quad (2)$$

$$\Psi(x) = \frac{qN_D}{\epsilon S}\left(Wx - \frac{1}{2}x^2\right) - \phi_{BN} \quad (3)$$

Where W is the depletion thickness of a diode, E(x) is an electric field intensity as a function of a distance x, $\psi(x)$ is an electric potential energy, $\epsilon$s is a dielectric constant of a semiconductor (it is 13×8.85×10E−14 F/cm for GaAs), q is a charge (1.6×10E−19C) of electron, $V_{bi}$ is a barrier potential, $V_R$ is a reverse supply voltage, $N_D$ is a doping concentration ($10E15\ cm^{-3}$), x is a distance from is a junction boundary to a semiconductor, and $\phi_{BN}$ a junction barrier height energy.

From the above calculated result, the electric field intensity as a function of the distance x is linearly reduced. The depletion thickness W at a typical voltage 5 V is greater than 2.5 μm and the electric field intensity at a junction is 3.4×10E4 V/cm. If the supply voltage $V_R$ is zero volts and the distance x is 0, the electric field of 1.4×10E4 V/cm is induced. However, since the electric field intensity linearly decreases with increasing x, the design should integrate the position of the quantum well structure and the electric field between intervals thereof in order to efficiently use the absorption coefficient variation of the multiple quantum well.

In the $GaAs/In_xGa_{1-x}As$ quantum well structure, the absorption coefficient at the electric field intensity of about 10 KV/cm or less is 5500/cm. During design for a normal off condition or impedance matching conditions with the absorption coefficient of 2700/cm at the electric field intensity of 4×10E4 KV/cm, a sufficient effect is obtained with the intermediate layer of 2 μm or less thick. Since this thickness is sufficient to the depletion thickness of a metal (e.g. Au)/semiconductor junction, an efficient operation is possible.

Figure 5A:
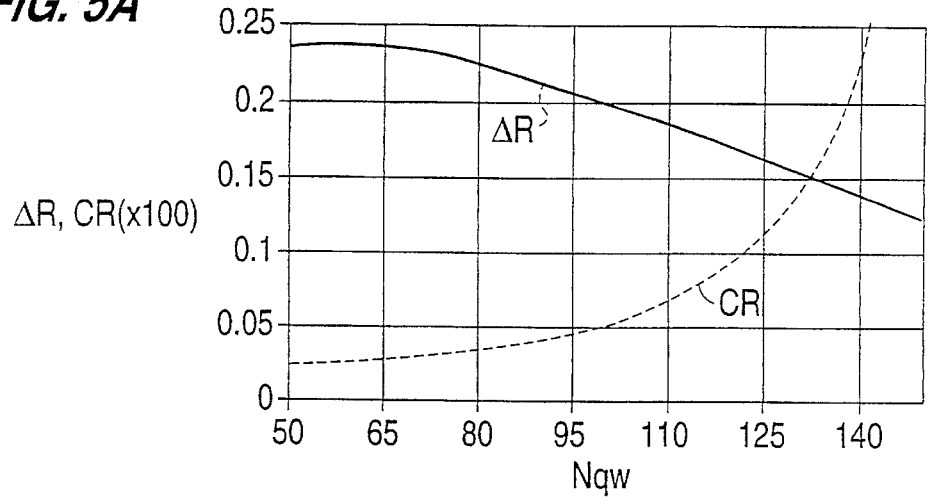
FIGS. 5A, 5B and 5C are graphs showing a reflectance difference $\Delta R$ and a signal ratio CR at a reflectance of 0.15, 0.3 and 0.5, respectively when a reflectance Rf of a semiconductor mirror layer and the periodic number Nqw of quantum wells vary and a reflectance of a metal layer is 95% in a metal-GaAs/InGaAs-n-type semiconductor diode.
Figure 5B:
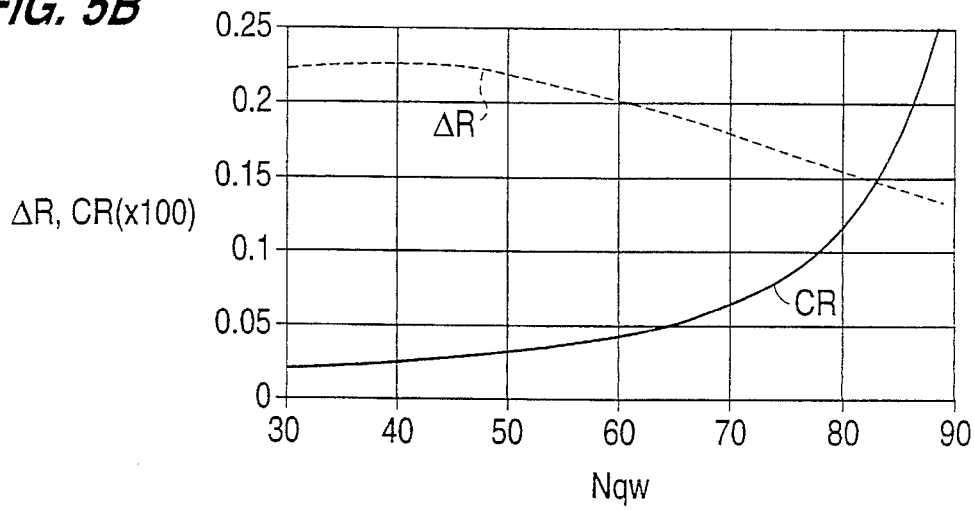
Figure 5C:
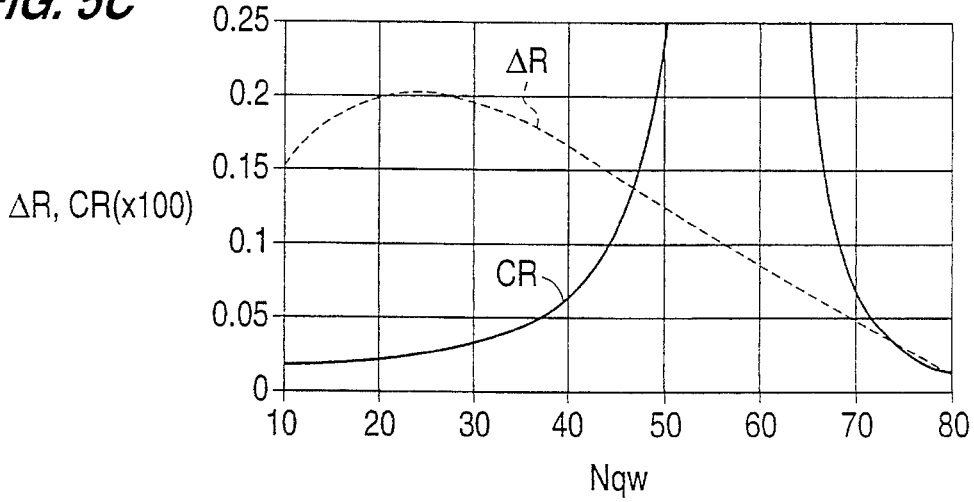

FIGS. 5A, 5B and 5C show a reflectance difference ΔR and a signal ratio CR when a reflectance Rf of a semiconductor mirror layer and the periodic number Nqw of quantum wells vary at the reflectance 95% of the metal layer in a unsymmetrical resonance structure using the $GaAs/In_xGa_{1-x}As$ multiple quantum well structure. If the reflectance Rf of the semiconductor mirror layer increases, the number of quantum wells decreases due to an increase in the efficiency and the value of the signal difference decreases. If the reflectance of the semiconductor mirror layer decreases, the value of the signal difference increases and the number of quantum wells increases, thereby requiring a higher operating voltage. In the case of a 95% metal layer and a 15% semiconductor mirror, the number of quantum wells necessary for the impedance matching conditions is over 150 and a higher voltage is needed, thereby causing breakdown of the diode. If 100 quantum wells are selected, the thickness of the intermediate layer is 1.5 μm which is suitable for a diode operation, ΔR is 20% and CR is 5. Similarly, a variety of device characteristics can be obtained by adjusting the reflectance difference ΔR, signal ratio CR, operating voltage, reflectance of the semiconductor mirror, etc., with these values being maintained at operating light by a thermal conduction effect of the metal layer. Therefore, applications with laser light etc. for a high-speed operation is possible.

As described above, the optical logic device using the metal/n-type (or p-type) semiconductor junction Schottky diode according to the present invention has the following characteristics:

1) The thin doping intermediate layer and the metal layer forming a Schottky junction are applied instead of a p-type (or n-type) electrode layer and a upper mirror layer of the conventional pin structure. The upper metal layer is used as a mirror with a high reflectance and semiconductor mirror layers corresponding to the bottom mirror of the conventional pin structure is used as a mirror with a low reflectance. The bottom of the GaAs substrate is formed with a non-reflective layer and thus an optical signal is received from the substrate direction.

2) To achieve an optical logic device structure receiving the optical signal from the substrate direction, the multiple quantum well structure using a compound semiconductor with a wavelength region longer than GaAs is formed with a distortion grown layer and the position within the intermediate layer is optimized.

3) The optical logic structure and optical modulation structure can be achieved by optimizing the periodic number of quantum wells and the position within the intermediate layer.

4) Growth steps are simplified by omitting a growth process of the p-type (or n-type) semiconductor and the upper mirror layer of the conventional optical device structure. Since the device manufacturing process is reduced, there are economic advantages.

5) The deterioration of device performance caused by a local temperature rise is overcome by forming a junction between the metal layer and the intermediate layer of the Schottky diode.

While there is shown and described the preferred embodiment of invention, it will be understood by those skilled in the art that foregoing and other changes in form and details may be made without departing from the spirit and scope of the present invention.

What is claimed is:

1. A metal/semiconductor junction Schottky diode optical device formed on a structure comprising:

a plurality of GaAs mirror and AlAs mirror layers grown on a semi-insulating GaAs substrate, one of an n+ and a p+ semiconductor layer formed on said GaAs mirror and AlAs mirror layers, a GaAs buffer layer formed on said one of said n+ and p+ semiconductor layer providing a Schottky metal layer serving as an electrode and a mirror, and a multiple quantum well structure having an electro-optical absorption characteristic, formed between said one of said n+ and p+ semiconductor layer and Schottky metal layer, to provide a diode with said multiple quantum well structure.

2. A metal/semiconductor junction Schottky diode optical device as claimed in claim 1, wherein at least a part of said mirror layers and diode are formed with a layer in order to have resonance and non-resonance conditions between said metal layer and mirror layers.

3. A metal/semiconductor junction Schottky diode optical device as claimed in claim 1, wherein said substrate on which said diode is formed has an opposite side formed with an optical non-reflective layer.

* * * * *